(12) United States Patent
Shi et al.

(10) Patent No.: US 8,323,990 B2
(45) Date of Patent: Dec. 4, 2012

(54) RELIABILITY TEST STRUCTURE FOR MULTILEVEL INTERCONNECT

(75) Inventors: Wen Shi, Shanghai (CN); Wei Wei Ruan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 55 days.

(21) Appl. No.: 11/728,184

(22) Filed: Mar. 22, 2007

(65) Prior Publication Data

US 2008/0128693 A1    Jun. 5, 2008

(30) Foreign Application Priority Data

Nov. 30, 2006   (CN) .......................... 2006 1 0119025

(51) Int. Cl.
*G01R 31/26*   (2006.01)
(52) U.S. Cl. .............. 438/17; 257/48; 438/18; 438/468; 438/927
(58) Field of Classification Search .................... 257/48, 257/758; 438/17, 18
See application file for complete search history.

(56) References Cited

U.S. PATENT DOCUMENTS

| | | | |
|---|---|---|---|
| 5,900,735 A | 5/1999 | Yamamoto | |
| 6,534,853 B2 * | 3/2003 | Liu et al. | 257/692 |
| 6,680,484 B1 * | 1/2004 | Young | 257/48 |
| 6,897,475 B2 * | 5/2005 | Wang | 257/48 |
| 2003/0034558 A1 * | 2/2003 | Umemura et al. | 257/734 |
| 2004/0026693 A1 * | 2/2004 | McLaughlin et al. | 257/48 |
| 2004/0207383 A1 | 10/2004 | Wang | |
| 2005/0199875 A1 * | 9/2005 | Umemura et al. | 257/48 |

OTHER PUBLICATIONS

Jedec Publication, "Constant Temperature Aging to Characterize Aluminum Interconnect Metallization for Stress-Induce Voiding", JEP 139, JEDEC Solid State Technology Association, Dec. 2000.
Jedec Standard, "Isothermal Electromigration Test Procedure", JESD61A.01, JEDEC Solid State Technology Association, Oct. 2007.

* cited by examiner

*Primary Examiner* — David Vu
*Assistant Examiner* — Caleb Henry
(74) *Attorney, Agent, or Firm* — Kilpatrick Townsend & Stockton LLP

(57) ABSTRACT

Embodiments in accordance with the present invention relate to structures and methods allowing stress-induced electromigration to be tested in multiple interconnect metallization layers. An embodiment of a testing structure in accordance with the present invention comprises at least two segments of a different metal layer through via structures. Each segment includes nodes configured to receive force and sense voltages. Selective application of force and sense voltages to these nodes allows rapid and precise detection of stress-induced immigration in each of the metal layers.

19 Claims, 10 Drawing Sheets

RELIABILITY TEST STRUCTURE FOR MULTILEVEL INTERCONNECT

CROSS-REFERENCE TO RELATED APPLICATION

The instant application claims priority to Application No. 200610119025.9 filed in the People's Republic of China on Nov. 30, 2006 and incorporated by reference in its entirety herein for all purposes.

BACKGROUND OF THE INVENTION

The present invention is directed to integrated circuits and their processing for the manufacture of semiconductor devices. In particular, the invention provides a method and system for testing the integrity of multi-level interconnect structures. More particularly, the invention provides a method and device for testing for breakdown in conductivity of an interconnect structure attributable to electromigration, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process including testing limitations exist with certain conventional processes and testing procedures for wafer reliability.

As merely an example, aluminum metal layers have been the choice of material for semiconductor devices as long as such layers have been used in the first integrated circuit device. Aluminum had been the choice since it provides good conductivity and sticks to dielectric materials as well as semiconductor materials.

Most recently, aluminum metal layers have been replaced, in part, by copper interconnects. Copper interconnects have been used with low k dielectric materials to form advanced conventional semiconductor devices. Copper has improved resistance values of aluminum for propagating signals through the copper interconnect at high speeds.

As devices become smaller and demands for integration become greater, limitations in copper and low k dielectric materials include unwanted migration of Cu or other conducting materials into other portions of the integrated circuit. Accordingly, conducting copper features are typically encased within barrier materials such as silicon nitride (SiN), which impede the diffusion of the copper.

Cu dislocation at post-CMP copper surface and SiN cap is one of top killer mechanisms affecting copper backend reliability failures as well as electric failures. One example of such a failure is local bridging of two or multiple metal lines by HTOL stress.

Examples of Cu dislocation triggered by electromigration include copper mass migration, void formation during grain growth, and grain boundary reorganization. Controlling Cu dislocation is a key solution to improve reliability and yield issues due to such related fail modes.

FIG. 1A shows simplified cross-sectional view of a copper feature 2 formed within dielectric 4 and sealed by overlying silicon nitride barrier layer 6. FIG. 1A shows that the presence of topography such as hillocks 8 and voids 10 in the copper, can produce uneven thickness and passivation in the overlying SiN barrier layer. As a result, upon exposure of the copper-containing structure to the flow of charge, stress release along grain boundaries of the copper can result in unwanted migration, breaking the SiN barrier.

FIG. 1B is an electron micrograph showing a cross section of metal bridging after stress due to copper dislocation. FIG. 1B shows the electrically stressed metal lines fabricated without copper dislocation control, where bulk copper migration outside of trench is seen. This migration caused an electric short and destroyed the functionality of the die.

The sudden and catastrophic failure of the device of FIG. 1A is to be avoided. Accordingly, engineers have developed tests for estimating the amount of migration expected to occur in a device experiencing the application of a potential difference. These tests involve the application of voltage to test structures on the surface of the chip. These test structures are not intended to operate during actual functioning of the chip, but rather are present solely to allow the application of voltage to access the amount of unwanted migration that is expected to occur.

Conventionally, separate test structures have been required to evaluate the potential for migration in each conducting layer. Such multiple test structures occupy valuable real estate on the chip that is more profitably allocated to active devices.

From the above, it is seen that improved techniques and test structures for predicting the reliability of semiconductor devices is desired.

BRIEF SUMMARY OF THE INVENTION

Embodiments in accordance with the present invention relate to structures and methods allowing stress-induced electromigration to be tested in multiple interconnect metallization layers. An embodiment of a testing structure in accordance with the present invention comprises at least two segments of a different metal layer through via structures. Each segment includes nodes configured to receive force and sense voltages. Selective application of force and sense voltages to these nodes allows rapid and precise detection of stress-induced immigration in each of the metal layers.

An embodiment of an interconnect test structure in accordance with the present invention, comprises, a first metallization layer formed on a substrate, the first metallization layer having a first portion and a second portion. A second metallization layer is formed on the substrate, the second metallization layer having a first portion and a second portion. A dielectric layer lies between the first and second metallization layers. A first electrically conducting via extends through the dielectric layer into contact with the first portion of the first metallization layer and with the first portion of the second metallization layer. A second electrically conducting via extends through the dielectric layer into contact with the first portion of the second metallization layer and with the second portion of the first metallization layer. A third electrically conducting via extends through the dielectric layer into contact with the second portion of the first metallization layer and with the second portion of the second metallization layer, wherein the first and second metallization layer are not configured to be in electrical communication with an interconnect structure on the substrate.

An embodiment of an electromigration test method in accordance with the present invention, comprises, disposing a test structure on a substrate, the test structure comprising a first metallization layer having a first portion and a second portion, and a second metallization layer having a first portion and a second portion. The test structure further comprises a dielectric layer between the first and second metallization layers, and a first electrically conducting via extending through the dielectric layer into contact with the first portion of the first metallization layer and with the first portion of the second metallization layer. The test structure further comprises a second electrically conducting via extending through the dielectric layer into contact with the first portion of the second metallization layer and with the second portion of the first metallization layer. The test structure further comprises a third electrically conducting via extending through the dielectric layer into contact with the second portion of the first metallization layer and with the second portion of the second metallization layer. A force voltage is applied to one of the first and second portions of one of the first and second metallization layers, and a changed sense voltage over time is detected at another of the one of the first and second portions of one of the first and second metallization layers, wherein the changed sense voltage reveals electromigration in at least one of the first and second metallization layers.

An embodiment of a method in accordance with the present invention for fabricating an interconnect test structure, comprises, patterning a lower metallization layer on a substrate to form a first portion and a second portion not in contact with other portions of the first metallization layer. A dielectric layer is formed over the first metallization layer, and a first electrically conducting via is formed extending through the dielectric layer into contact with a first end of the first portion of the first metallization layer. A second electrically conducting via is formed extending through the dielectric layer into contact with a second end of the first portion of the first metallization layer. A third electrically conducting via is formed extending through the dielectric layer into contact with a first end of the second portion of the first metallization layer. A second metallization layer is patterned on the dielectric layer such that a first portion of the second metallization layer is in contact with the first conducting via, a first end of a second portion of the second metallization layer is in contact with the second conducting via, and a second end of the second portion of the second metallization layer is in contact with the third conducting via.

Various additional objects, features and advantages of the present invention can be more fully appreciated with reference to the detailed description and accompanying drawings that follow.

DETAILED DESCRIPTION OF THE INVENTION

Conventionally, testing of interconnect metallization structures has investigated different failure mechanisms. For example, the failure point may lie near the top or the bottom of a via connecting different metal lines, or may lie along the metal line itself.

Incorporated herein by reference for all purposes are the following document: EIA/JEDEC Standard EIA/JESD61 (April 1997), entitled "Isothermal Electromigration Test Procedure". This document describes a standardized test for evaluating electromigration (EM) along the lines of metallization components of interconnect structures. In particular, this test is used to identifying electromigration occurring along relatively long metal lines, for example pieces of metallization having a length of 200 µm or greater, and typically 800 µm or greater. This EM test is performed by applying a force voltage at a force node of a test structure to induce the electromigration, and receiving at a sense node a sense voltage revealing a changed electrical resistance resulting from electromigration of the metal material.

Figure 1A:
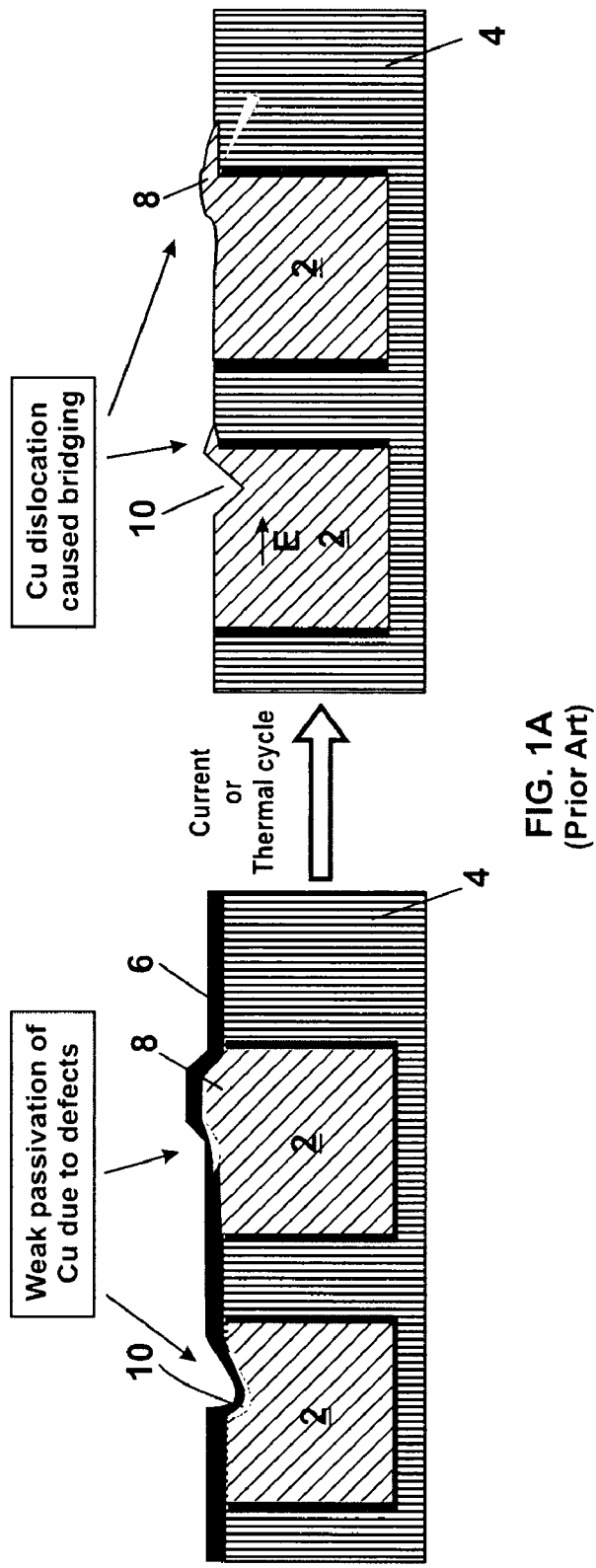
FIG. 1A is a simplified cross-sectional view of a copper structure experiencing unwanted copper migration in response to a thermal cycle.
Figure 1B:
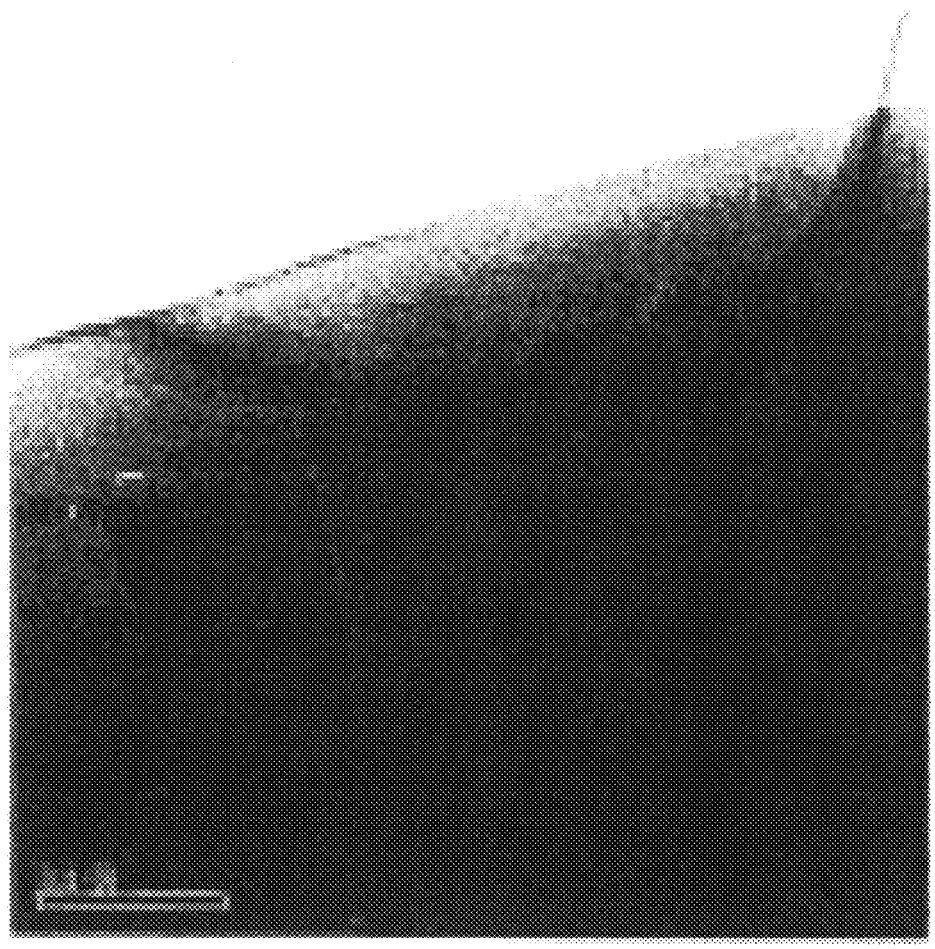
FIG. 1B is an electron micrograph showing a cross section of metal bridging after stress due to copper dislocation.
Figure 2A:
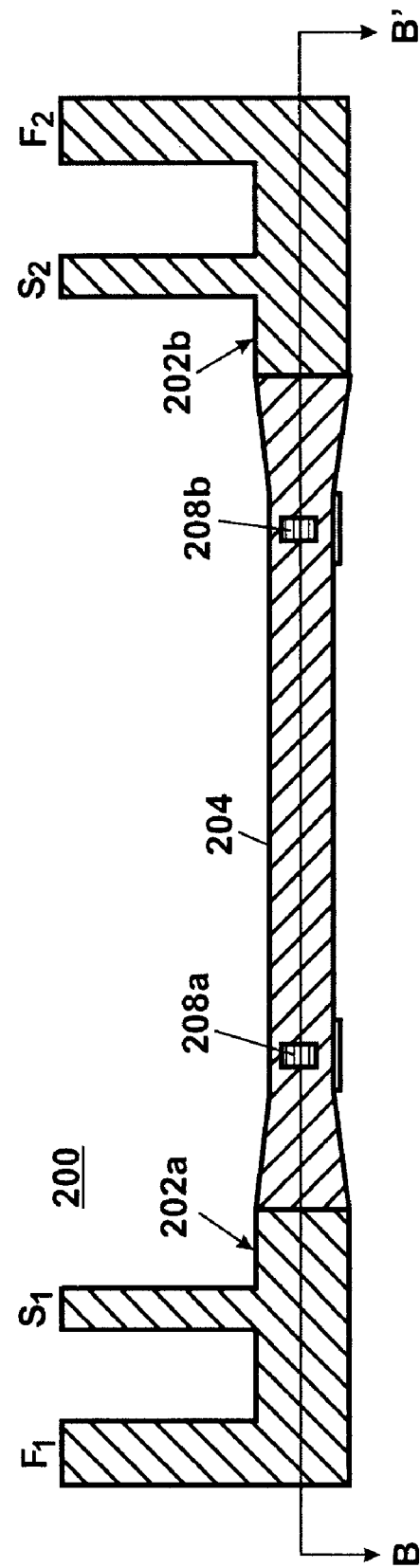
FIG. 2A shows a simplified plan view of a conventional structure for testing migration in an upper metal layer (Metal_2) of a semiconductor device.
Figure 2B:
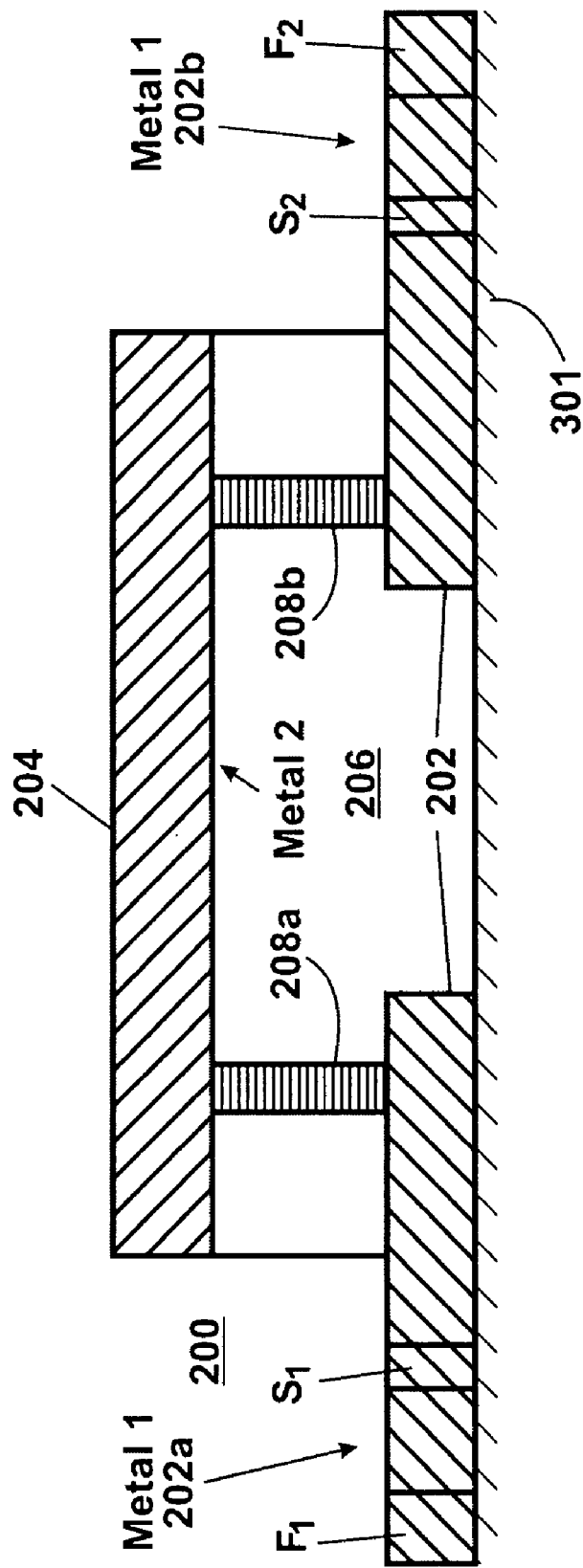
FIG. 2B shows a simplified cross-sectional view of the conventional test structure of FIG. 2A.

Conventionally, different test structures were employed to identify EM along different metal layers. FIG. 2A shows a simplified plan view of a first conventional structure for testing for electromigration in an upper metal layer (Metal_2) of a semiconductor device. FIG. 2B shows a simplified cross-sectional view of the conventional test structure of FIG. 2A.

Specifically, conventional test structure 200 comprises lower metallization layer 202 formed on substrate 201. Here, the term substrate is used generally to refer to a workpiece which may have one or more layers previously formed thereon. Lower metallization layer 202 is separated from upper metallization layer 204 by interlayer dielectric 206. Conducting via 208a allows electrical conductivity to be established between a first portion 202a of the lower metallization layer 202 and the upper metallization layer 204 having a length (i.e. $\geq$200 µm) necessary to allow observation of EM under typical conditions. Conducting via 208b allows electrical conductivity to be established between the upper metallization layer 204 and a second portion 202b of the lower metallization layer 202.

First portion 202a of lower metallization layer 202 features a first force node (F1) and a first sense node (S1). Force node F1 is of a larger size to allow biasing at a higher voltage. Second portion 202b of lower metallization layer 202 features a second force node (F2) and a second sense node (S2). Again, the force node F2 is of a larger size to allow biasing at a higher (force) voltage.

The conventional test structure 200 shown in FIGS. 2A-B is configured to identify the existence of electromigration in the upper metallization line of the test structure, and by inference electromigration in upper metal lines of actual interconnect structures. Specifically, a force bias is applied to force voltage node F1, and the resulting voltage is sensed at voltage node S1. A change in the resistance of the upper line, as revealed by a change in voltage sensed at voltage node S1 over time per Ohm's law, indicates the existence of electromigration in the upper line. Alternatively, a force bias may be applied in the other direction across the upper metallization layer, at force voltage node F2, and the resulting voltage sensed at voltage node S2. A change in the resistance of the upper line, as revealed by a change in voltage sensed at voltage node S2 over time per Ohm's law, indicates electromigration to have occurred in the upper line.

Figure 3A:
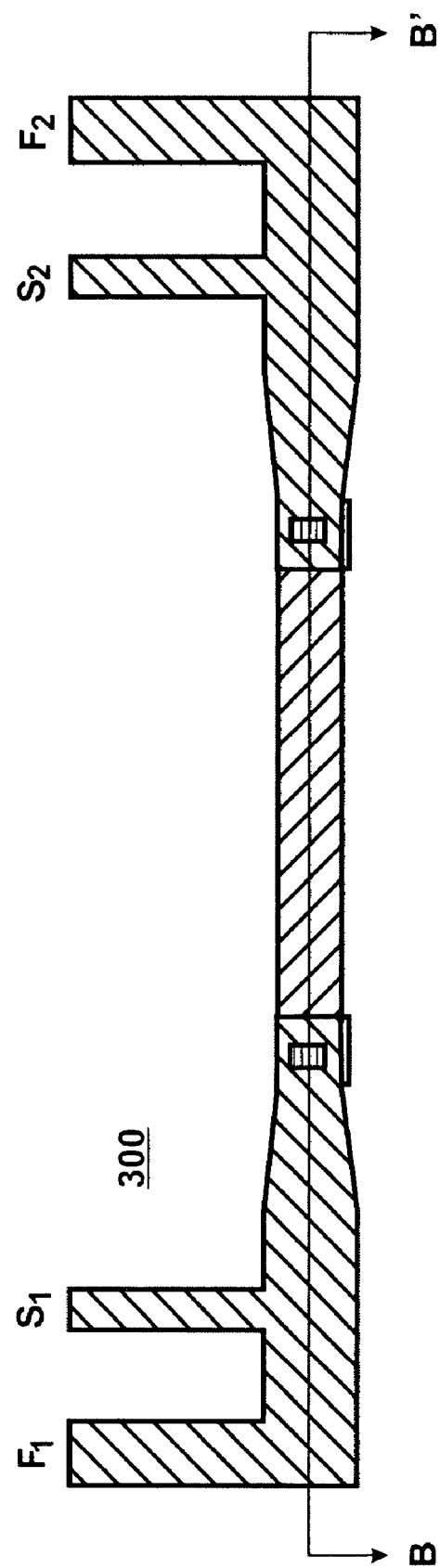
FIG. 3A shows a simplified plan view of a conventional structure for testing migration in a lower metal layer (Metal_1) of a semiconductor device.
Figure 3B:
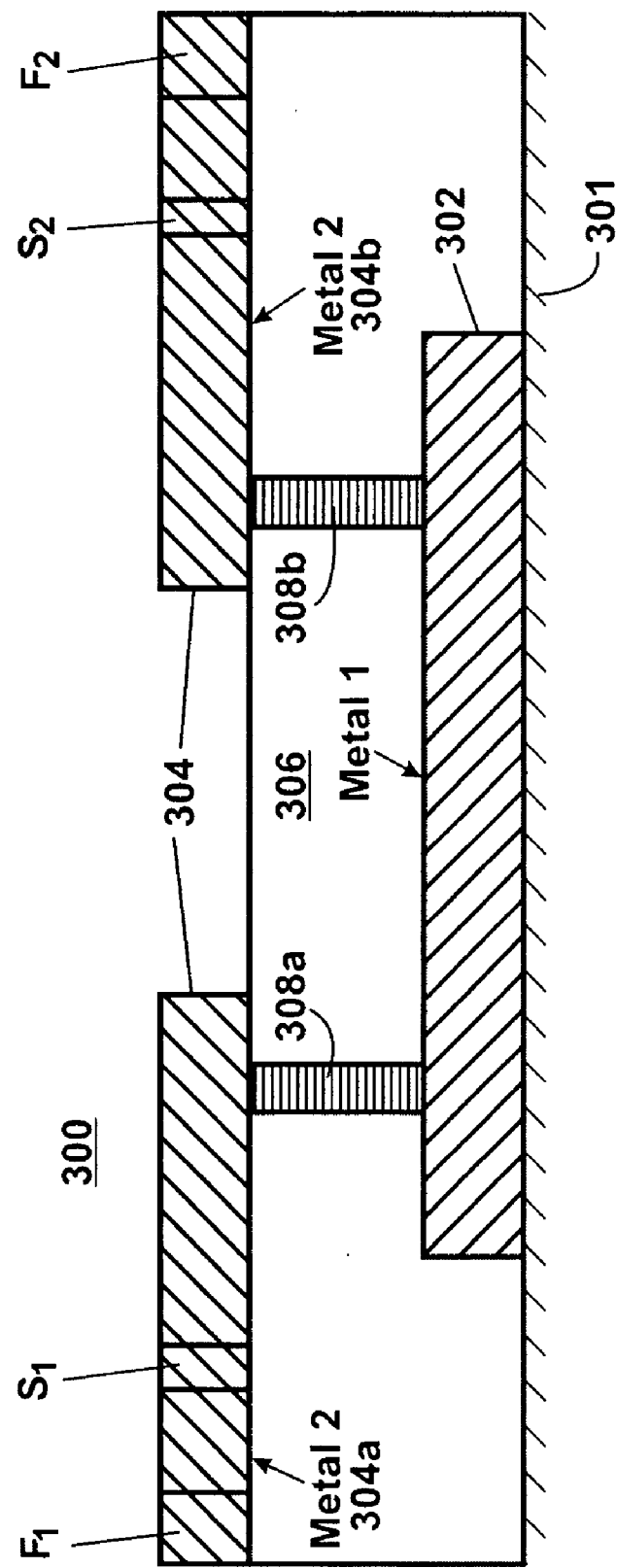
FIG. 3B shows a simplified cross-sectional view of the conventional test structure of FIG. 3A.

To identify electromigration in a lower metallization portion of the interconnect structure, a different test structure was conventionally used. FIG. 3A shows a simplified plan view of a conventional structure for testing migration in a lower metal layer (Metal_1) of a semiconductor device. FIG. 3B shows a simplified cross-sectional view of the conventional test structure of FIG. 3A.

Specifically, conventional test structure 300 comprises lower metallization layer 302 formed on substrate 301. Here, the term substrate is used generally to refer to a workpiece which may have one or more layers previously formed thereon. Lower metallization layer 302 is separated from upper metallization layer 304 by interlayer dielectric 306. Conducting via 308a allows electrical conductivity to be established between a first portion 304a of the upper metallization layer 304 and the lower metallization layer 302 having a length necessary (i.e. ≧200 μm) to allow observation of EM under typical conditions. Conducting via 308b allows electrical conductivity to be established between the lower metallization layer 302 and a second portion 304b of the upper metallization layer 304.

The conventional test structure 300 shown in FIGS. 3A-B is configured to identify the existence of electromigration in a lower metal line of the test structure, and by inference electromigration in lower metal lines of actual interconnect structures. Specifically, a force bias is applied to force voltage node F1, and the resulting voltage is sensed at voltage node S1. A change in the resistance of the lower line, as revealed by a change in voltage sensed at voltage node S1 over time per Ohm's law, indicates the existence of electromigration in the lower line. Alternatively, a force bias may be applied in the other direction across the lower metallization layer, at force voltage node F2, and the resulting voltage sensed at voltage node S2. A change in the resistance of the lower line, as revealed by a change in voltage sensed at voltage node S2 over time per Ohm's law, indicates electromigration to have occurred in the lower line.

Figure 4:
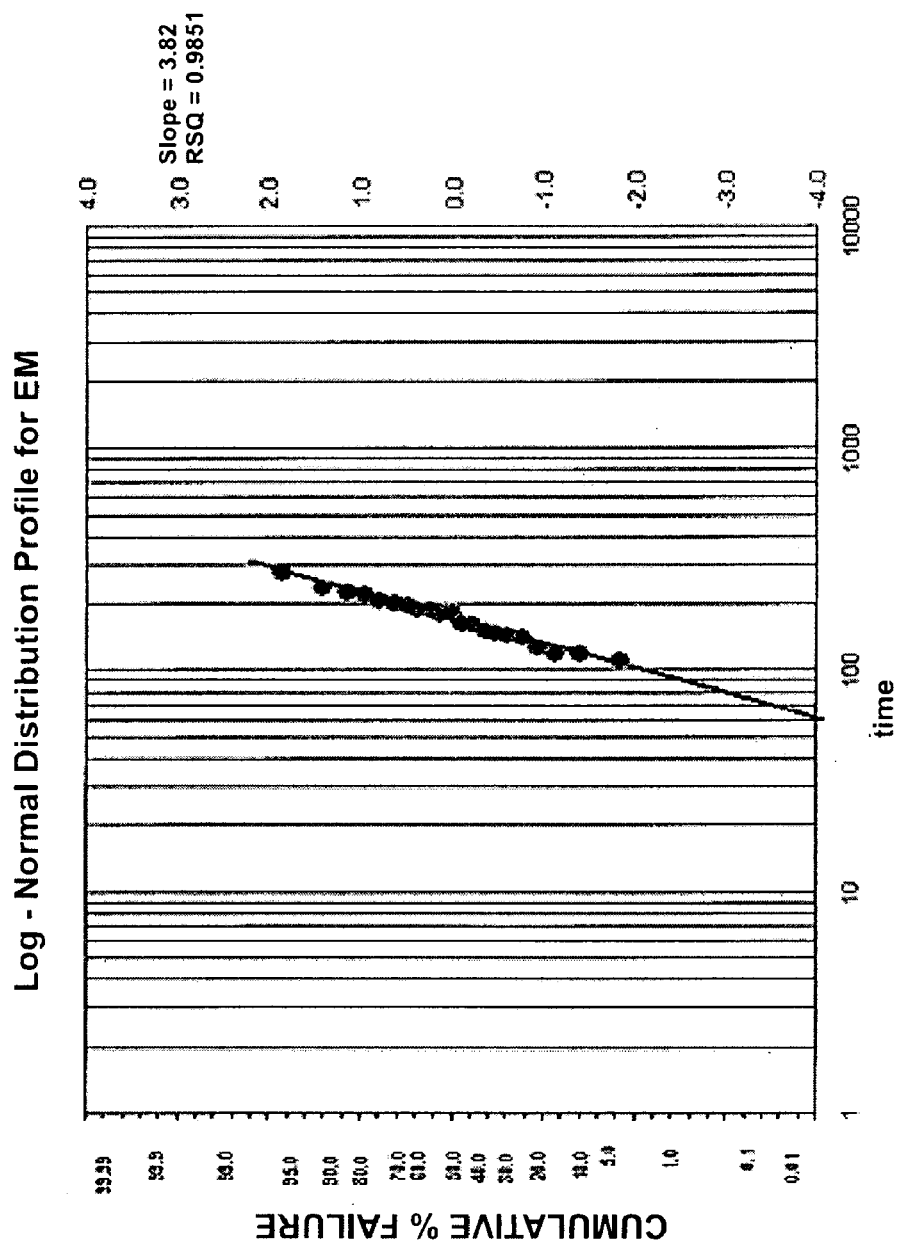
FIG. 4 plots cumulative % failure versus time for an exemplary stress migration test.

FIG. 4 plots cumulative % failure versus time, for an exemplary conventional electromigration test. Specifically, in FIG. 4 the criteria for failure is a changed resistance (ΔR) greater than or equal to 20% of the original resistance (Ro) exhibited by the interconnect structure. Judgment for pass/fail is lifetime at 0.1%>10-yr @ 110° C., Jop, which means that the acceptable failure rate is less than or equal to one in one thousand over a ten year period. In the plot of FIG. 4, the interconnect structure passed this criteria. Specifically, the intersection of the line with the x-axis is greater than 10, meaning that the first expected failure would appear after ten years.

Figure 5A:
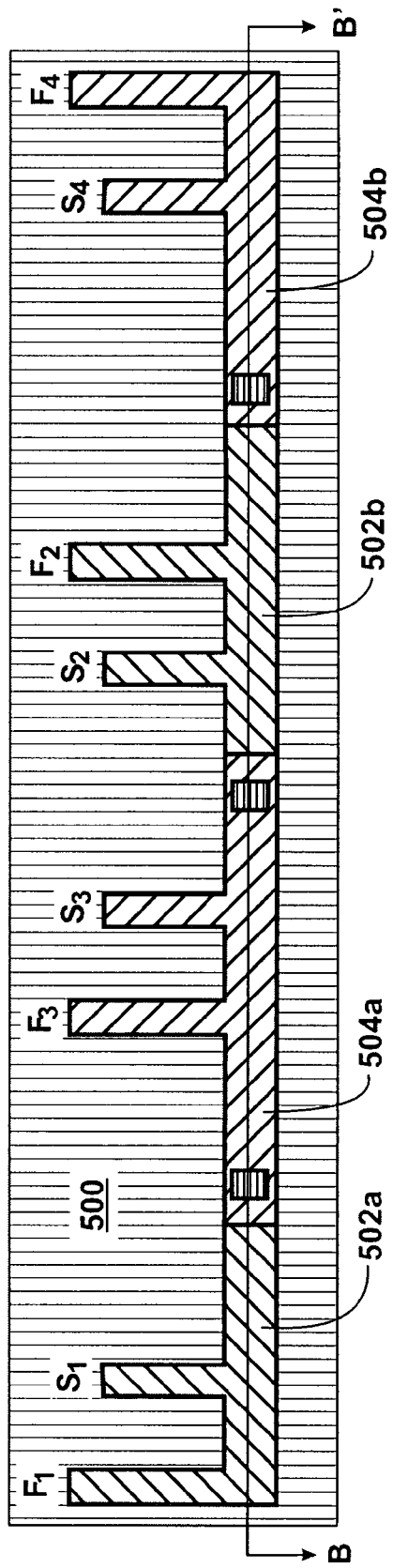
FIG. 5A shows a simplified plan view of an embodiment of a structure for testing migration in either or both metal layers (Metal_1 and Metal_2) of a semiconductor device.
Figure 5B:
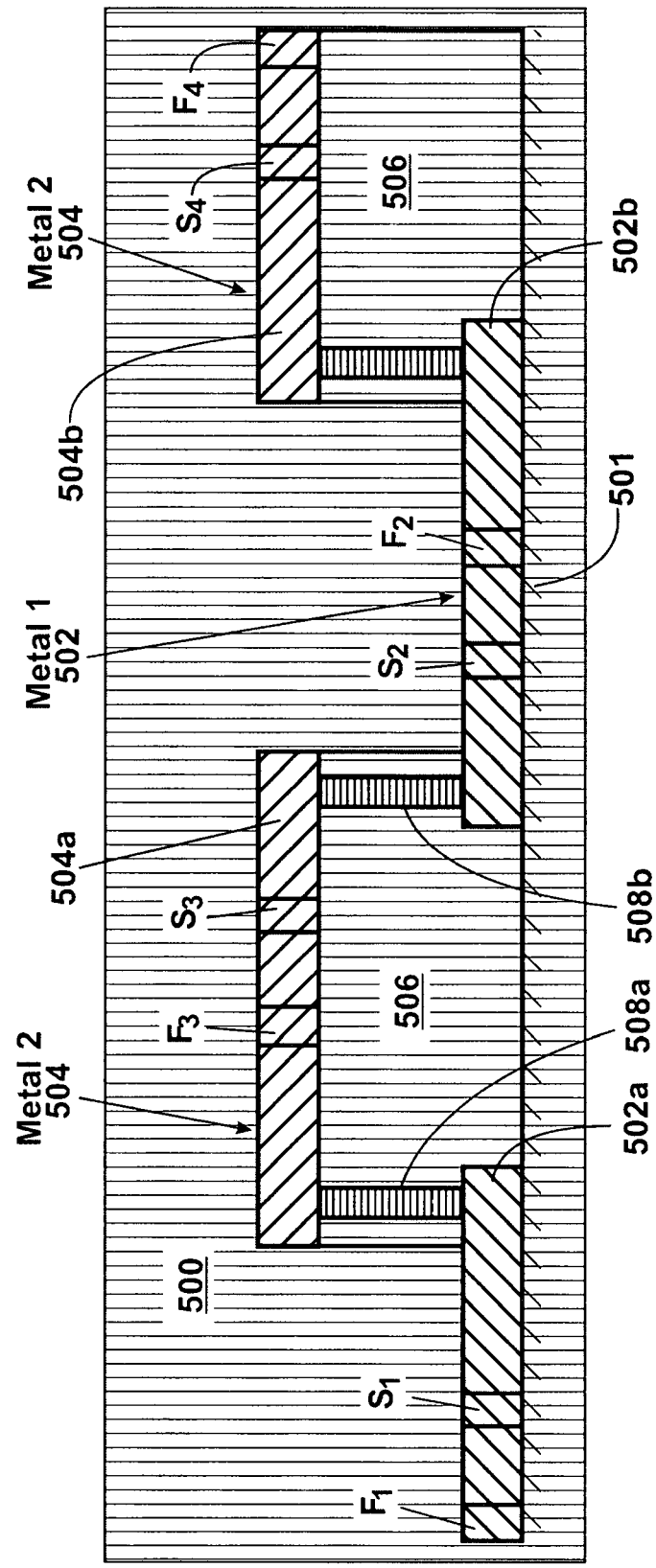
FIG. 5B is a simplified cross-sectional view of the embodiment of the test structure shown in FIG. 5A.

Embodiments of methods and structures in accordance with the present invention combine into a single test structure, the functions performed by the different conventional test structures of FIGS. 2A-B and 3A-B. FIG. 5A shows a simplified plan view of an embodiment of a structure for testing electromigration in either or both of lower and upper metal layers (Metal_1 and Metal_2) of an interconnect structure. FIG. 5B is a simplified cross-sectional view of the embodiment of the test structure shown in FIG. 5A.

Test structure 500 comprises lower metallization layer (Metal_1) 502 formed on substrate 501. Here, the term substrate is used generally to refer to a workpiece which may have one or more layers previously formed thereon. Lower metallization layer 502 is separated from upper metallization layer (Metal_2) 504 by interlayer dielectric 506. Lower metallization layer 502 comprises separate portions 502a and 502b, each having a length sufficient to observe electromigration under testing conditions. First portion 502a of lower metallization line 502 includes a force voltage node F1 and a sense voltage node S1. Second portion 502b of lower metallization line includes a force voltage node F2 and a sense voltage node S2.

Upper metallization layer 504 comprises separate portions 504a and 504b, each also having a length sufficient to observe electromigration under testing conditions. First portion 504a of upper metallization line 504 includes a force voltage node F3 and a sense voltage node S3. Second portion 504b of upper metallization line includes a force voltage node F4 and a sense voltage node S4.

First conducting via 508a allows electrical conductivity to be established between first portion 502a of lower metallization layer 502 and first portion 504a of upper metallization layer 504. Second conducting via 508b allows electrical conductivity to be established between first portion 504a of upper metallization layer 504 and second portion 502b of lower metallization portion 502. Third conducting via 508c allows electrical conductivity to be established between second portion 502b of lower metallization layer 502 and second portion 504b of upper metallization layer 504.

Test structure 500 of FIGS. 5A-B is configured to identify the existence of electromigration in one or both of the lower and upper metal lines of the test structure, and by inference the existence of electromigration in actual interconnect structures. Specifically, by selective application of a force bias to various terminals, the existence of electromigration in various locations of the test structure may be detected. In particular, a changed resistance of the metal line intervening between a force node, as revealed by a change in voltage sensed at the voltage node over time per Ohm's law, indicates electromigration to have occurred in that intervening line.

By combining the two conventional test structures into a single test structure, it is possible to observe two surfaces of a via by connecting different terminals. For example, the existence of electromigration somewhere in the test structure may first be determined by application of force voltages to nodes F1 and F4 while sensing voltage at nodes S1 and S4.

Where some change in voltage (and hence resistance) across the entire test structure is sensed by changed resistance per Ohm's Law, thereby revealing electromigration, the exact location of this electromigration can then be determined by selective application of force voltages to intervening nodes. For example, a force voltage could be applied between the nodes F1/F3, and the sense voltage measured to determine if the electromigration damage was in the extent between F1 and S3. Using the same approach, extent between F3 and F2, S2 and F4 and so on can be checked for electromigration.

The following TABLE provides an example of a result utilizing the testing structure of FIGS. 5A-B:

TABLE

| FORCE NODE | SENSE NODE | | | |
|---|---|---|---|---|
| | S1 | S2 | S3 | S4 |
| F1 | — | ○ | ○ | X |
| F2 | ○ | — | ○ | X |
| F3 | ○ | ○ | — | X |
| F4 | X | X | X | — |

○ = no changed resistance detected
X = changed resistance detected

From this result, it can be determined that the location of electromigration damage to the interconnect test structure of FIGS. 5A-B, likely lies in the region between node S2 and node F4.

Electromigration testing utilizing a test structure in accordance with an embodiment of the present invention may be performed under a variety of conditions. For example, the force voltage may be applied to the structure under varying temperature conditions. A change in temperature of the test structure may be achieved prior to, or during, application of voltage thereto, in order to detect unwanted electromigration under a variety of thermal conditions.

Figures 6, 6A:
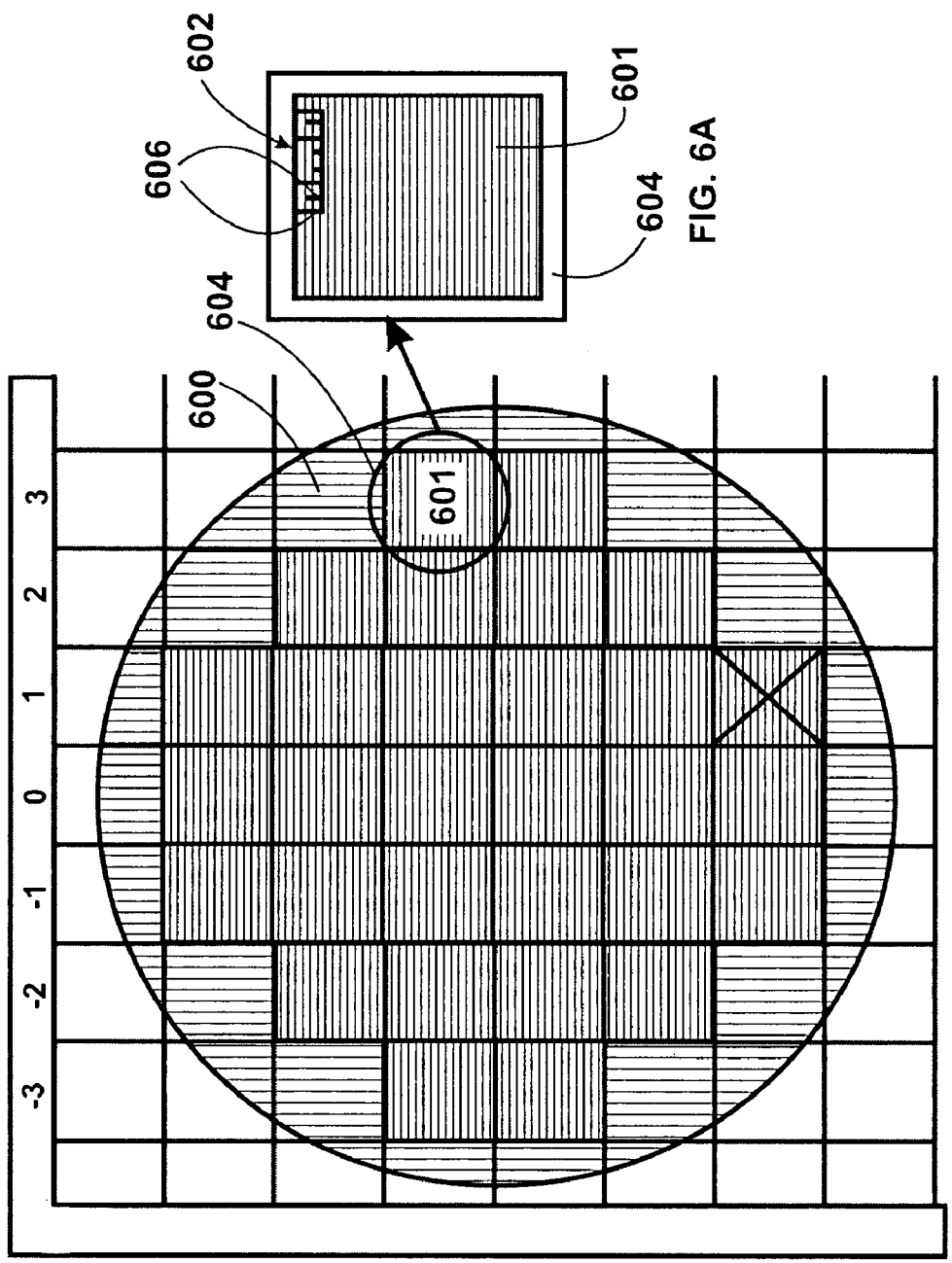
FIG. 6 is a plan view of a semiconductor substrate bearing chips having test structures in accordance with embodiments of the present invention fabricated thereon.
FIG. 6A is a simplified enlarged view of one chip fabricated on the substrate of FIG. 6.

FIG. 6 is a plan view of a semiconductor substrate 600 bearing chips having test structures in accordance with embodiments of the present invention fabricated thereon. FIG. 6A is a simplified enlarged view of one chip fabricated on the substrate of FIG. 6. FIGS. 6A-B show test structure 602 present on chip 601 proximate to scribe line 604, such that sense-force nodes 606 on the scribe line and hence readily accessible for testing.

A test structure in accordance with embodiments of the present invention may be fabricated utilizing techniques such as are known in the art. For example, the upper and lower metallization layers may be patterned by electroplating metal such as copper within a recess of a dielectric layer, and then removing the electroplated metal outside the recess by chemical mechanical polishing (CMP). The electrically conducting vias of the test structure may be formed by etching through the dielectric layer, and then depositing conducting material such as tungsten therein.

Embodiments of test methods and apparatuses in accordance with the present invention offer a number of benefits over existing approaches. One important advantage is the conservation of space on the chip. Specifically, the conventional requirement for the presence of multiple test structures, along with corresponding contact nodes, occupies valuable real-estate on the chip. By consolidating multiple test structures, the amount of space occupied by the test structures is reduced, and freed up for use by active devices.

While the present invention has been described and illustrated so far in connection with one specific embodiment, the present invention is not limited to this particular structure. For example, the present invention is not limited to identifying electromigration within an interconnect structure having only two layers. In an alternative embodiment, a test structure in accordance with the present invention could incorporate more than two metallization layers. Such an embodiment would feature force and sense nodes on each portion of each of the various metallization layer, to allow precise location of incidence of electromigration within the test structure. Specifically, if some failures occurred, such a multi-layer test structure can be used to detect the rough location of a void within the multiple layers of metallization. The void can be ascertained by measuring the resistance of each of the two terminals and shrinking the scope incrementally, until the test structure can be used to recognize a void within a small range, thereby saving time and cost for failure analysis.

Moreover, while the specific embodiments of test methods and structures have been described above in connection with performing the JEDEC EM test described above, the present invention is not limited to this particular application. Other types of defects within interconnect structures can also be detected utilizing alternative embodiments of the present invention.

For example, JEDEC publication JEP139 (December 2000), entitled "Constant Temperature Aging to Characterize Aluminum Interconnect Metallization for Stress-Induced Voiding", relates to testing for the existence of voids resulting from stress migration (SM) of materials. This document is incorporated by reference herein for all purposes.

This stress migration test may be performed upon embodiments of structures in accordance with the present invention. Specifically, a voltage is applied across one force node, and a change in voltage over time is detected at a sense node on the other side of the metallization line. The magnitude of the voltage change, and the manner of its change over time, indicates the character of any electromigration that is occurring. Use of an embodiment of a test structure in accordance with the present invention for stress migration allows an operator to identify the location of the point of failure within a small range. This also saves time and cost.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electromigration test method comprising:
    disposing a test structure on a substrate, the test structure comprising,
        a first metallization layer having a first portion and a second portion, and
        a second metallization layer having a first portion and a second portion,
        a dielectric layer between the first and second metallization layers,
        a first electrically conducting via extending through the dielectric layer and in direct contact with the first portion of the first metallization layer and with the first portion of the second metallization layer,
        a second electrically conducting via extending through the dielectric layer and in direct contact with the first portion of the second metallization layer and with the second portion of the first metallization layer,
        a third electrically conducting via extending through the dielectric layer and in direct contact with the second portion of the first metallization layer and with the second portion of the second metallization layer;
    applying a force voltage to one of the first and second portions of one of the first and second metallization layers; and
    detecting a changed sense voltage over time at another of the one of the first and second portions of one of the first and second metallization layers, wherein the changed sense voltage reveals a location of electromigration in at least one of the first and second metallization layers.

2. The electromigration test method of claim 1 further comprising:
applying a second force voltage to a different one of the first and second portions of the one of the first and second metallization layers, the different one of the first and second portions of the one of the first and second metallization layers intermediate between a location of application of the force voltage and a location of detection of the changed sense voltage; and
detecting a second changed sense voltage to locate a position of the electromigration in the test structure.

3. The electromigration test method of claim 1 wherein the force voltage is applied to a force node exposed by a scribe line, and the sense voltage is detected on a sense node exposed by the scribe line.

4. The electromigration test method of claim 1 further comprising changing a temperature of the substrate prior to or during application of the force voltage.

5. The electromigration test method of claim 1 wherein each of the first and second portions of the first metallization layer comprises a force node and a sense node.

6. The electromigration test method of claim 5 wherein the force and sense nodes of the first metallization layer extend to a scribe line.

7. The electromigration test method of claim 5 wherein the sense node is disposed between the force node and the electrically conducting via connecting the first and second metallization layers.

8. The electromigration test method of claim 1 wherein each of the first and second portions of the second metallization layer comprises a force node and a sense node.

9. The electromigration test method of claim 8 wherein the force and sense nodes of the second metallization layer extend to a scribe line.

10. The electromigration test method of claim 8 wherein the sense node is disposed between the force node and the electrically conducting via.

11. The electromigration test method of claim 8 wherein the sense node is disposed between the force node and the electrically conducting via connecting the first and second metallization layers.

12. The electromigration test method of claim 1 wherein the first metallization layer underlies the second metallization layer.

13. The electromigration test method of claim 1 wherein the second metallization layer underlies the first metallization layer.

14. The electromigration test method of claim 1 wherein the first and second metallization layers form successive metallization layers of the test structure.

15. The electromigration test method of claim 1 wherein at least one of the first and second metallization layers comprises copper.

16. The electromigration test method of claim 1 wherein one of the first, second, and third electrically conducting vias comprises tungsten.

17. The electromigration test method of claim 1 wherein the first and second portions of the first metallization layer have a length of about 200 microns or greater.

18. The electromigration test method of claim 1 wherein the first and second portions of the second metallization layer have a length of about 200 microns or greater.

19. The electromigration test method of claim 1 further comprising forming on a scribe line of the substrate, a force node and a sense node of the first portion of the first metallization layer, a force node and a sense node of the second portion of the first metallization layer, a force node and a sense node of the first portion of the second metallization layer, and a force node and a sense node of the second portion of the second metallization layer.

* * * * *